United States Patent
Moon et al.

(10) Patent No.: US 8,053,821 B2
(45) Date of Patent: Nov. 8, 2011

(54) IMAGE SENSOR WITH HIGH CONVERSION EFFICIENCY

(75) Inventors: Kyoung-Sik Moon, Hwaseong-si (KR); Jung-Chak Ahn, Yongin-si (KR); Moo-Sup Lim, Seoul (KR); Sung-Ho Choi, Seoul (KR); Kang-Sun Lee, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 251 days.

(21) Appl. No.: 12/321,665

(22) Filed: Jan. 23, 2009

(65) Prior Publication Data
US 2009/0200627 A1      Aug. 13, 2009

(30) Foreign Application Priority Data
Jan. 25, 2008    (KR) .................. 10-2008-0008125

(51) Int. Cl.
*H01L 31/062*       (2006.01)
(52) U.S. Cl. ........ 257/292; 257/291; 257/293; 257/432; 257/E27.001
(58) Field of Classification Search .................. 257/291, 257/292, 293, 432, E27.001
See application file for complete search history.

(56) References Cited

U.S. PATENT DOCUMENTS

| 6,573,578 B2 | 6/2003 | Kimura et al. ................ 257/431 |
| 2005/0077588 A1* | 4/2005 | Kasuga ........................ 257/432 |

FOREIGN PATENT DOCUMENTS

JP   2006-054252   *   2/2006

OTHER PUBLICATIONS

Korean Patent Application No. 1019980061146 to Jung et al., having Publication date of Jul. 15, 2000 (w/ English Abstract page).
Korean Patent Application No. 1020010052646 to Takeshi et al., having Publication date of Jun. 19, 2002 (w/ English Abstract page).
Japanese Patent Application No. 2000-373113 to Shigeji et al., having Publication date of Jun. 21, 2002 (w/ English Abstract page).
Japanese Patent Application No. 2004-233557 to Yoshiharu having Publication date of Feb. 23, 2006 (w/ English Abstract page).

* cited by examiner

*Primary Examiner* — Tan N Tran
(74) *Attorney, Agent, or Firm* — Monica H Choi

(57) ABSTRACT

An image sensor includes a photoelectric converter, a reflector, and a charge carrier guiding region. The reflector is disposed under the photoelectric converter, and the charge carrier guiding region is disposed between the photoelectric converter and the reflector. The reflector reflects incident light passed by the photoelectric converter back through the photoelectric converter for increasing photoelectric conversion efficiency and reduced crosstalk. The charge carrier guiding region dissipates undesired charge carriers for further increasing photoelectric conversion efficiency.

20 Claims, 13 Drawing Sheets

IMAGE SENSOR WITH HIGH CONVERSION EFFICIENCY

This application claims priority under 35 USC §119 to Korean Patent Application No. 10-2008-0008125, filed on Jan. 25, 2008 in the Korean Intellectual Property Office, the disclosure of which is incorporated herein in its entirety by reference.

BACKGROUND OF THE INVENTION

1. Field of the Invention

The present invention relates generally to image sensors, and more particularly, to an image sensor having increased efficiency in conversion of received light.

2. Background of the Invention

A photoelectric converter is formed in a silicon (Si) area that absorbs light in a visible spectrum within an image sensor such as a CMOS (complementary metal oxide semiconductor) image sensor (CIS) or a charge-coupled device (CCD). Light having a wavelength in a shorter wavelength range is absorbed by Si at a greater rate such that most of such light is absorbed by the photoelectric converter.

However, as the wavelength of light increases, the absorption rate of such light by Si decreases. In particular, a photoelectric converter having a limited depth just passes most of light having a wavelength in a longer wavelength range resulting in decreased conversion efficiency and thus decreased sensitivity.

Moreover, charge carriers such as electrons generated at a deep region in a lower portion of a photoelectric converter of a pixel diffuse to photoelectric converters of other adjacent pixels resulting in crosstalk between pixels.

SUMMARY OF THE INVENTION

Accordingly, an image sensor according to embodiments of the present invention is formed with enhanced conversion efficiency and minimized crosstalk.

An image sensor according to an aspect of the present invention includes a photoelectric converter, a reflector, and a charge carrier guiding region. The reflector is disposed under the photoelectric converter, and the charge carrier guiding region is disposed between the photoelectric converter and the reflector.

When light reaches the reflector after passing through the photoelectric converter, the reflector reflects such light back through the photoelectric converter.

In another embodiment of the present invention, the image sensor further comprises a substrate disposed below the reflector.

In a further embodiment of the present invention, the photoelectric converter includes a photodiode and a P+ type pinning layer. The photodiode has an N-type region formed in a P-well. The P+ type pinning layer is formed on the N-type region toward a surface of the N-type region.

In another embodiment of the present invention, the charge carrier guiding region is doped with a P-type dopant and is biased with a low power voltage for dissipating holes.

In a further embodiment of the present invention, the reflector is comprised of an insulating material such as a buried silicon oxide layer.

In another embodiment of the present invention, the charge carrier guiding region surrounds the reflector.

In an example embodiment of the present invention, the reflector has a shape of a sheet of reflecting material disposed below a plurality of photoelectric converters.

In an alternative embodiment of the present invention, the reflector has a shape of a plurality of bars disposed parallel to each-other.

In another embodiment of the present invention, the reflector has a shape of a sheet of reflecting material disposed below a plurality of photoelectric converters with openings formed through the sheet of reflecting material.

In a further embodiment of the present invention, the reflector has a shape of a first plurality of bars disposed parallel to each-other in a first plane, and a second plurality of bars disposed parallel to each-other in a second plane. In an example embodiment of the present invention, the first plurality of bars does not overlap the second plurality of bars.

With such example shapes of the reflector, the charge carrier guiding region surrounds the reflector for dissipating charge carriers.

The present invention may be used to particular advantage when the image sensor is a CMOS image sensor. However, the present invention may be practiced with other types of image sensors.

In this manner, light that passes through the photoelectric converter is reflected back to the photoelectric converter for higher absorption rate of such light and minimized crosstalk. In addition, the charge carrier guiding region surrounds the reflector to dissipate undesired charge carriers for further increasing photoelectric conversion efficiency.

BRIEF DESCRIPTION OF THE DRAWINGS

The above and other features and advantages of the present invention will become more apparent when described in detailed exemplary embodiments thereof with reference to the attached drawings in which.

The figures referred to herein are drawn for clarity of illustration and are not necessarily drawn to scale. Elements having the same reference number in FIGS. 1, 2, 3, 4, 5, 6, 7, 8, 9, 10, 11, 12A, and 12B refer to elements having similar structure and/or function.

DETAILED DESCRIPTION OF THE INVENTION

Embodiments of the present invention are described herein for a CMOS (complementary metal oxide semiconductor) image sensor (CIS) with a photodiode used as a photoelectric converter. However, the present invention is not restricted thereto, and the present invention may be practiced with other types of image sensors and with other types of photoelectric converters.

Figure 1:
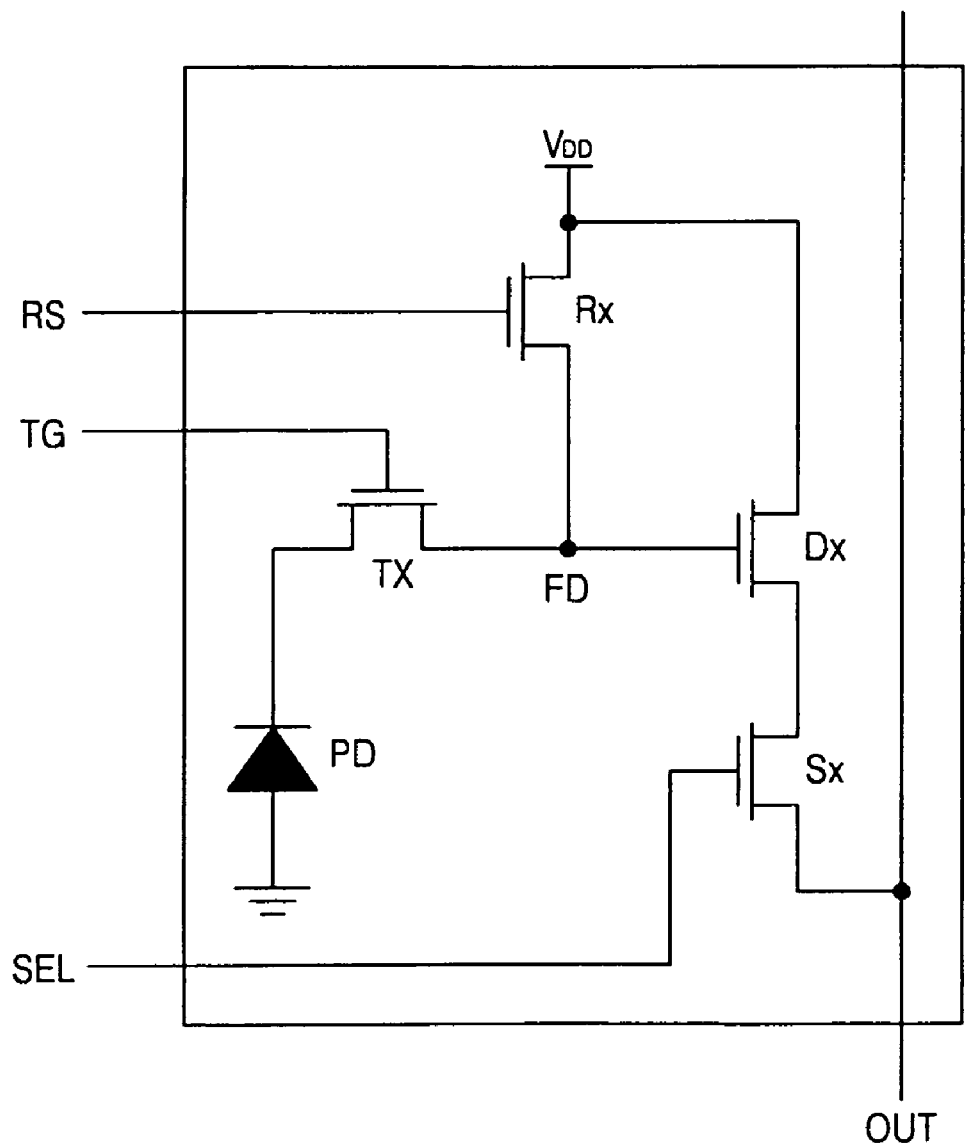
FIG. 1 is a circuit diagram of an example unit pixel in an image sensor according to an embodiment of the present invention.

FIG. 1 shows an outline of an example unit pixel of an image sensor that is a CMOS image sensor for example. The example unit pixel of FIG. 1 includes a photoelectric converter which may be a photodiode PD for generating electric charge from received light. The unit pixel also includes a transfer transistor Tx that transfers such electric charge generated from the photodiode PD to a floating diffusion region FD in response to a transfer control signal TG.

In addition, the unit pixel includes a reset transistor Rx that periodically resets the floating diffusion region FD using a high power voltage VDD in response to a reset control signal RS. The unit pixel further includes a drive transistor Dx that is configured as a source follower buffer amplifier for buffering a signal at the floating diffusion region FD. The unit pixel also includes a select transistor Sx that performs switching and addressing when the unit pixel is selected to generate an output signal in response to a select control signal SEL.

The example unit pixel of FIG. 1 includes a single photodiode PD and four MOSFETs (metal oxide semiconductor field effect transistors) Tx, Rx, Dx and Sx. However, the present invention is not restricted thereto, and the present invention may be practiced with other types of pixel structures including a photodiode and at least three transistors including a transfer transistor and a source follower buffer amplifier.

Figure 2:
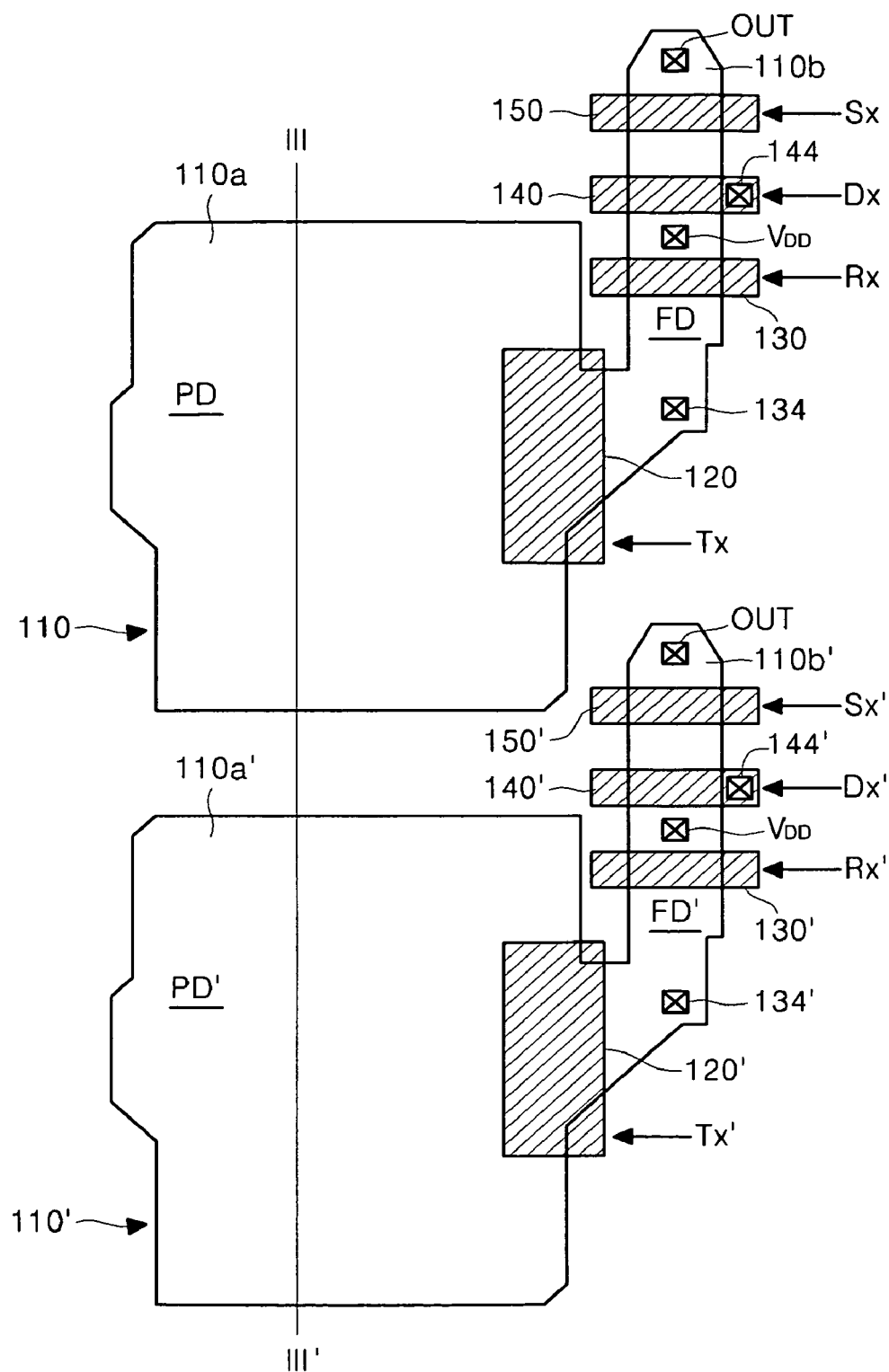
FIG. 2 is a layout of unit pixels in a CMOS image sensor according to an embodiment of the present invention.
Figure 3:
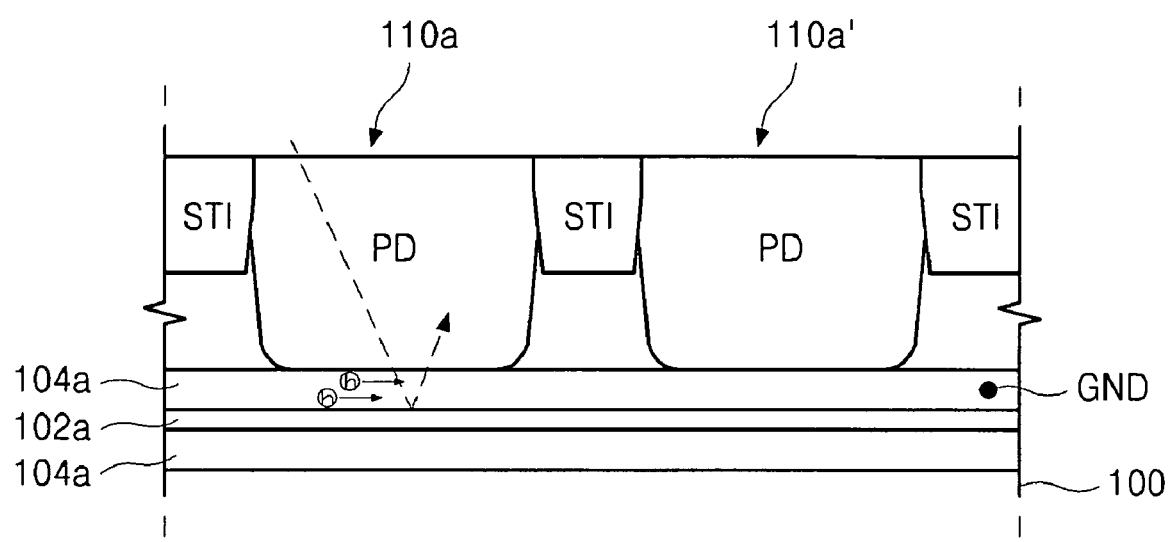
FIGS. 3, 5, 7 and 10 are cross-sectional views of the unit pixels taken along the line III-III' in FIG. 2, according to different embodiments of the present invention.

FIG. 2 shows a layout of the unit pixels of FIG. 1 according to an example embodiment of the present invention. FIG. 3 shows a cross-sectional view of the unit pixels taken along the line III-III' in FIG. 2.

FIG. 2 shows a first active region 110 for forming a first example unit pixel with a first photoelectric converter region 110a having a photoelectric converter such as a photodiode PD formed therein. FIG. 2 also shows a second active region 110' for forming a second example unit pixel with a second photoelectric converter region 110a' having another photoelectric converter such as a photodiode PD formed therein.

The areas of such first and second active regions 110 and 110' are defined by an isolation region such as a shallow trench isolation (STI) region for example in a pixel array area of the image sensor. The first active regions 110 and 110' are divided into respective photodiode regions 110a and 110a' having the photodiodes PD formed therein and respective transistor regions 110b and 110b' having transistors formed therein.

The first and second unit pixels are similarly formed in the first and second active regions 110 and 110'. Thus, the structure of the first unit pixel formed in the first active region 110 is now described.

The photodiode region 110a for receiving incident light is formed with a predetermined shape such as a quadrangle shape in a plane view for example, to occupy a predetermined area within the unit pixel. The example photodiode region 110a along with the adjacent photodiode region 110a' is now described in more detail with reference to FIG. 3.

A reflector 102a is disposed over a substrate 100 such as a semiconductor substrate comprised of silicon for example. Multiple photodiodes PD are disposed over the reflector 102a. In addition, a charge carrier guiding region 104a is disposed between the photodiodes PD and the reflector 102a. The charge carrier guiding region 104a is also disposed between the reflector 102a and the substrate 100 to surround the reflector 102a in an example embodiment of the present invention.

The reflector 102a increases an effective distance that light incident to the photodiode PD travels for increasing light conversion efficiency. In other words, the reflector 102a that is disposed below the photodiode PD reflects incident light that is not completely absorbed by the photodiode PD to pass back through the photodiode PD for maximizing light absorption by the photodiode PD for increasing the light conversion efficiency and thus sensitivity of the photodiode PD.

Without the reflector 102a, an electron-hole pair (EHP) is more prone to be generated outside a depletion region of the photodiode PD from incident light having a long wavelength. Such charge carriers may be transferred to other photodiodes through diffusion increasing the possibility of crosstalk. Thus the image sensor of FIG. 3 includes the reflector 102a such that the EHP is generated in the depletion region of the photodiode PD for reduced crosstalk between the pixels.

In an example embodiment of the present invention, the reflector 102a is comprised of an insulating material such as silicon oxide ($SiO_2$) for example. To form the reflector 102a according to an example embodiment of the present invention, oxygen is implanted into the substrate 100 comprised of silicon until oxygen is accumulated to a desired concentration at a predetermined depth in the silicon substrate 100. Subsequently, a heating process is performed such that the implanted oxygen reacts with the silicon substrate 100 to form the reflector 102a that is a buried insulating layer of silicon oxide ($SiO_2$).

Alternatively, the reflector 102a may be formed using silicon-on-insulator (SOI) technology, epitaxial lateral overgrowth (ELO), or wafer bonding.

Figure 4:
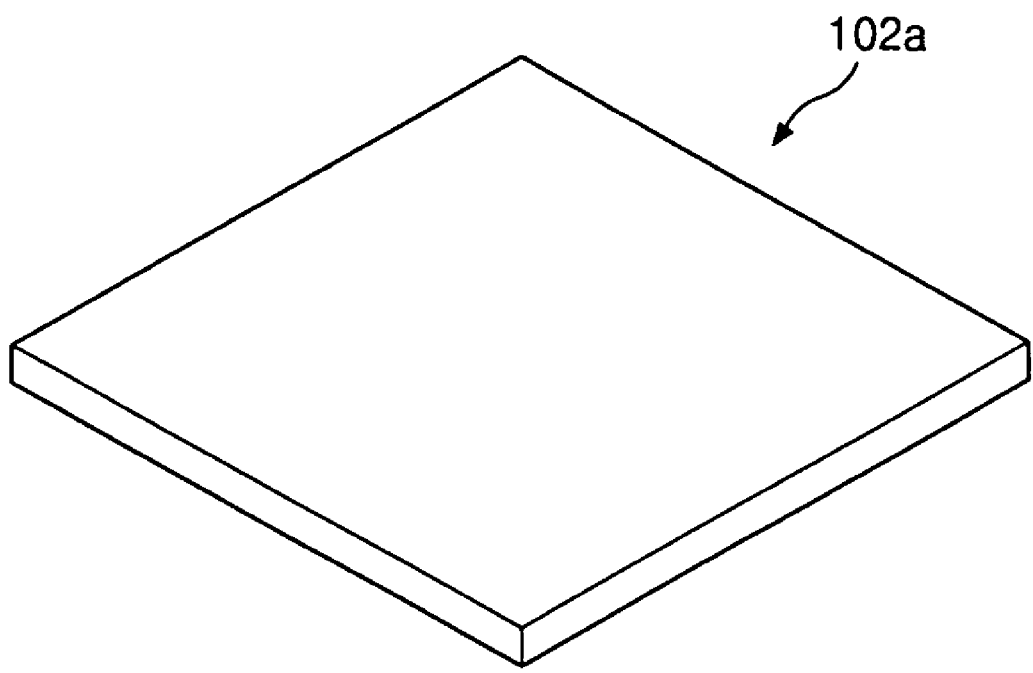
FIGS. 4, 6, 8, 9, and 11 are perspective views of example reflectors included in image sensors according to the different embodiments of the present invention.

As illustrated in FIG. 4 for an example embodiment of the present invention, the reflector 102a is formed in a shape of a sheet of reflecting material such as an insulating material. For example in FIG. 4, the reflector 102a is a rectangular sheet of insulating material that is disposed below a plurality of photoelectric converters of the image sensor.

In another embodiment of the present invention, the reflector 102a has a thickness of $(2n+1)\lambda/4$ (where "n" is 0 or an integer greater than 0, and $\lambda$ is a wavelength of incident light). Such a thickness results in optimum reflecting efficiency of the reflector 102a. For example, the reflector 102a has a thickness ranging from about 500/4 nm to about 750/4 nm.

Referring back to FIG. 3, the charge carrier guiding region 104a is disposed below the photodiode PD for dissipating undesired charge carriers such as holes generated from the photodiode PD for further increasing photoelectric conversion efficiency. In an example embodiment of the present invention, the charge carrier guiding region 104a is formed by high-density implantation of p-type ions.

Figure 12A:
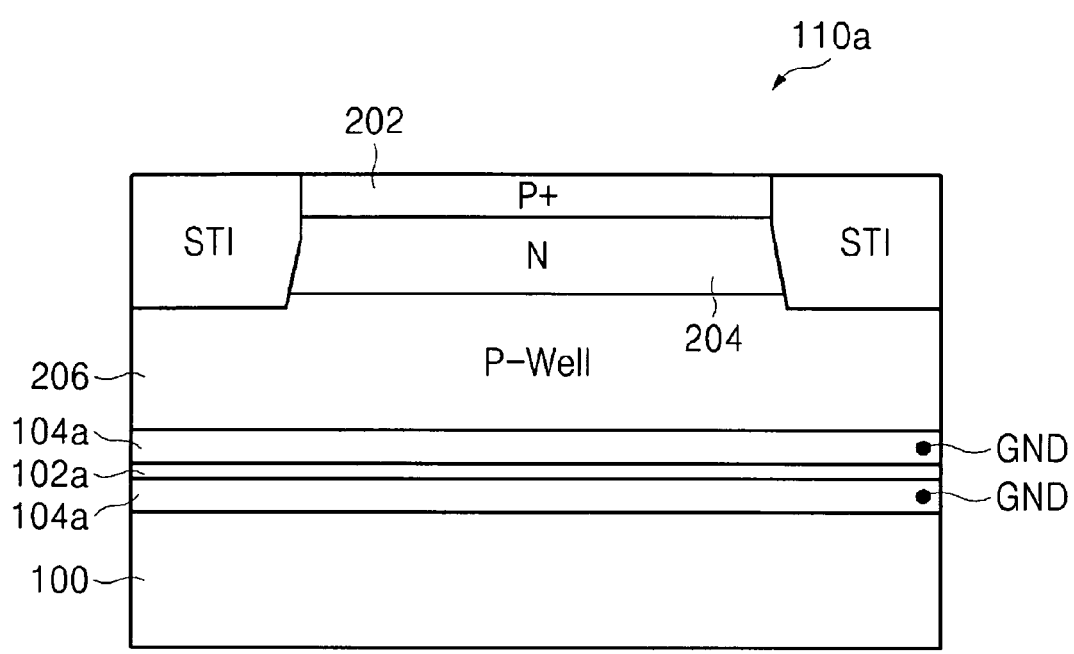
FIGS. 12A and 12B are cross-sectional views of the unit pixel with more detailed regions of a photoelectric converter according to example embodiments of the present invention.

Referring to FIG. 12A for an example embodiment of the present invention, the photodiode PD includes an N-type doped region 204 formed in a P-well 206 above the charge carrier guiding region 104a. In addition, a P+ type pinning layer 202 is formed toward the surface of the N-type region 204 for minimizing surface charge dissipation. A P-type dopant concentration of the charge carrier guiding region 104a is greater than a P-type dopant concentration of the P-well 206.

Figure 12B:
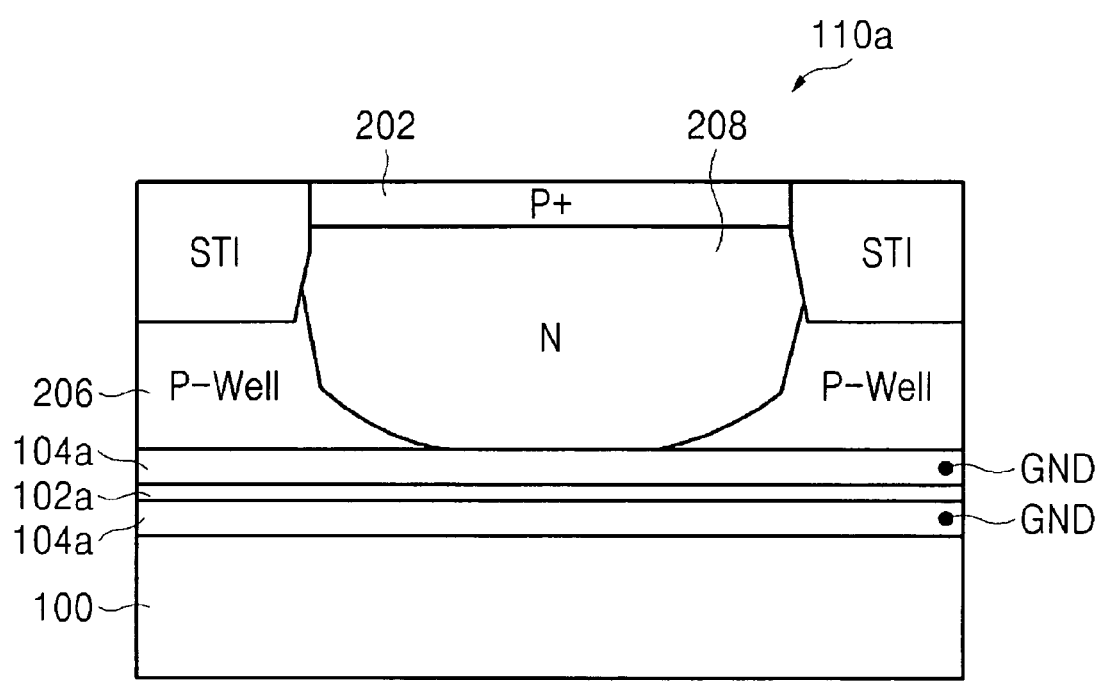

Referring to FIG. 12B for an alternative embodiment of the present invention, an N-type doped region 208 of the photodiode PD is formed in the P-well 206 but extends down to the charge carrier guiding region 104a. Otherwise, the photodiode PD of FIG. 12A is similar to the photodiode PD of FIG. 12B. Also in FIG. 12B, a P-type dopant concentration of the charge carrier guiding region 104a is greater than a P-type dopant concentration of the P-well 206.

The holes generated from the photodiode PD are accumulated in the charge carrier guiding region 104a. The charge carrier guiding region 104a is biased with a low power supply voltage such as the ground voltage GND for discharging the accumulated holes for enhanced device characteristics.

Referring back to the example unit pixel formed in the first active region 110 in FIG. 2, the transistor region 110b adjoins a part of the photodiode region 110a. The transistor region 110b is formed in a shape of a line having at least one bent region and has the transistors Tx, Rx, Dx, and Sx formed therein.

A gate 120 of the transfer transistor Tx is formed over a portion of the photodiode region 110a and a portion of the transistor region 110b. The transfer transistor Tx transfers electric charge accumulated at the photodiode PD to the floating diffusion region FD.

Further in FIG. 2, a gate 130 of the reset transistor Rx, a gate 140 of the drive transistor Dx, and a gate 150 of the select transistor Sx are disposed at predetermined intervals along the transistor region 110b. However, the present invention may be practiced with the transistors Rx, Dx and Sx being arranged in a different order from that illustrated in FIG. 2.

A portion of the transistor active region 110b between the gate 120 of the transfer transistor Tx and the gate 130 of the reset transistor Rx forms the floating diffusion region FD. The floating diffusion region FD stores electric charge transferred from the photodiode PD and is periodically reset by the reset transistor Rx. The drive transistor Dx buffers a signal from the electric charge stored at the floating diffusion region FD.

A source of the reset transistor Rx is connected with a power supply generating the high power voltage VDD. When the reset control signal RS (of FIG. 1) applied on the gate 130 of the reset transistor Rx is activated, the reset transistor Rx is turned on such that the potential at the floating diffusion region FD is charged from the high power voltage VDD applied at the source of the reset transistor Rx. As a result, the floating diffusion region FD is reset to a predetermined voltage (VDD-Vth, with Vth being a threshold voltage of the reset transistor Rx).

The floating diffusion region FD is connected to the gate 140 of the drive transistor Dx via an interconnection line (not shown) connecting a contact 134 of the floating diffusion region FD with a contact 144 of the gate 140 of the drive transistor Dx that is configured as a source follower amplifier buffer. The voltage at the floating diffusion region FD controls a current flowing through the select transistor Sx which has been turned on by the select control signal SEL applied on the gate 150 of the select transistor Sx.

The interconnection line connecting the contacts 134 and 144 is desired to be short for preventing decrease of conversion efficiency from capacitance of the conductive layer forming the interconnection line. When forming such an interconnection line, the contact 134 is not necessarily connected with the contact 144 in the same active region 110 but may be connected with another contact 144' in the adjacent active region 110' for attaining a short interconnection line. The current flowing through the select transistor Sx is output from an output terminal OUT of the unit pixel as an output signal of the unit pixel that is read by a load transistor (not shown) connected with the output terminal OUT.

Note that the second unit pixel of the second active region 110' includes similar structures 110a', 110b', 120', 130', 134', 140', 144', and 150' forming components PD', FD', Tx', Rx', Dx', and Sx' similarly as the first unit pixel of the first active region 110.

Figure 5:
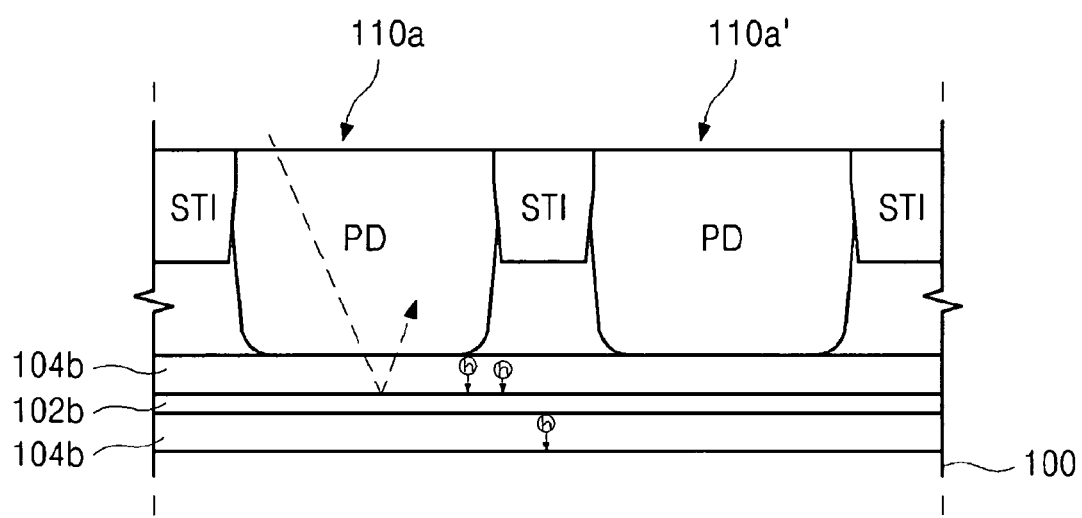
Figure 6:
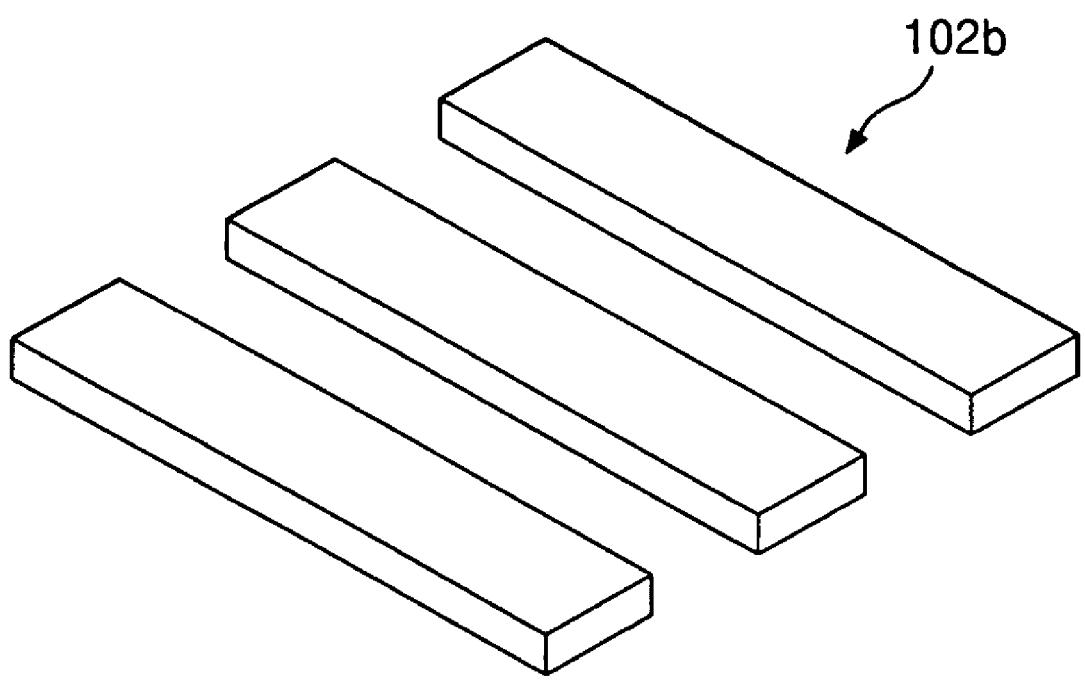

Alternative embodiments of the present invention are now described for different shapes of the reflector in reference to FIGS. 5, 6, 7, 8, 9, 10, and 11. Referring to FIGS. 2, 5, and 6, a reflector 102b has a shape of a plurality of bars disposed parallel along the line III-III' in FIG. 2. In FIG. 5, a charge carrier guiding region 104b is formed to surround the reflector 102b. The materials of the reflector 102b and the charge carrier guiding region 104b of FIG. 5 are similar to the materials of the reflector 102a and the charge carrier guiding region 104a, respectively, as described above in reference to FIG. 3.

Figure 7:
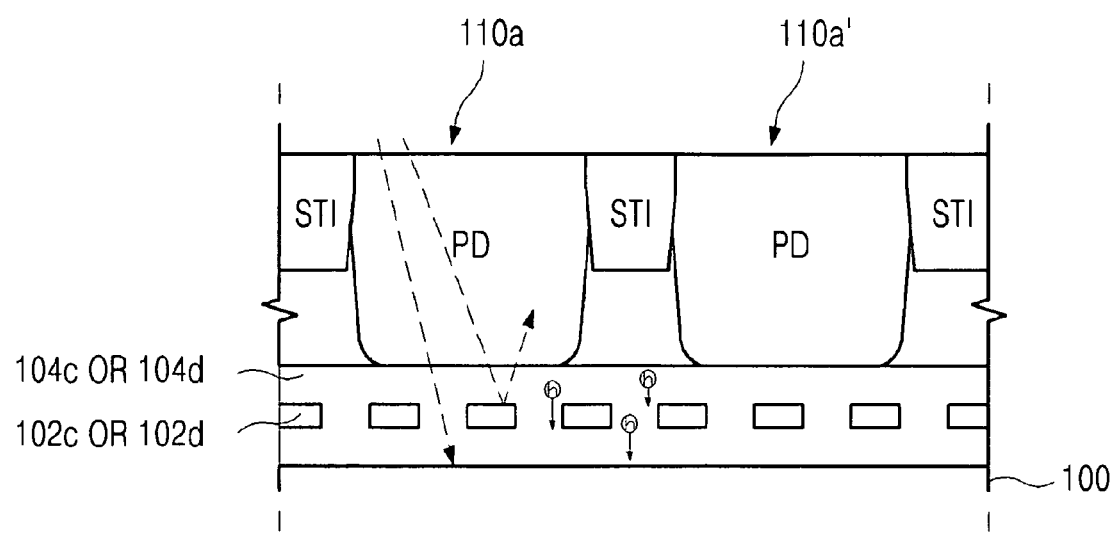
Figure 8:
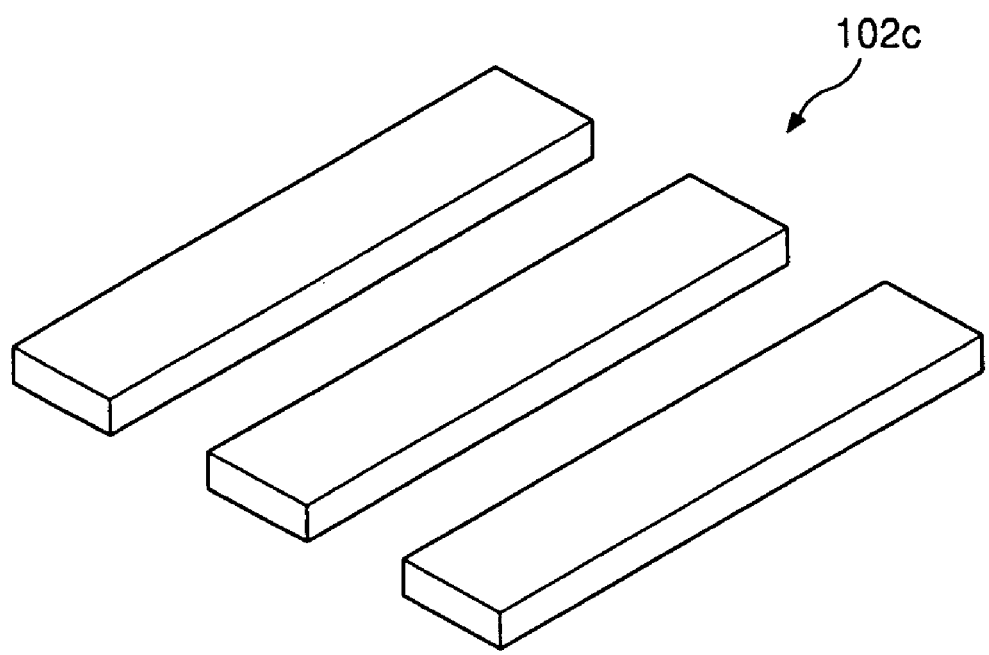

Alternatively referring to FIGS. 2, 7, and 8, a reflector 102c has a shape of a plurality of bars disposed perpendicular to the line III-III' in FIG. 2. In addition, a charge carrier guiding region 104c is formed to surround the reflector 102c. The materials of the reflector 102c and the charge carrier guiding region 104c of FIG. 7 are similar to the materials of the reflector 102a and the charge carrier guiding region 104a, respectively, as described above in reference to FIG. 3.

Figure 9:
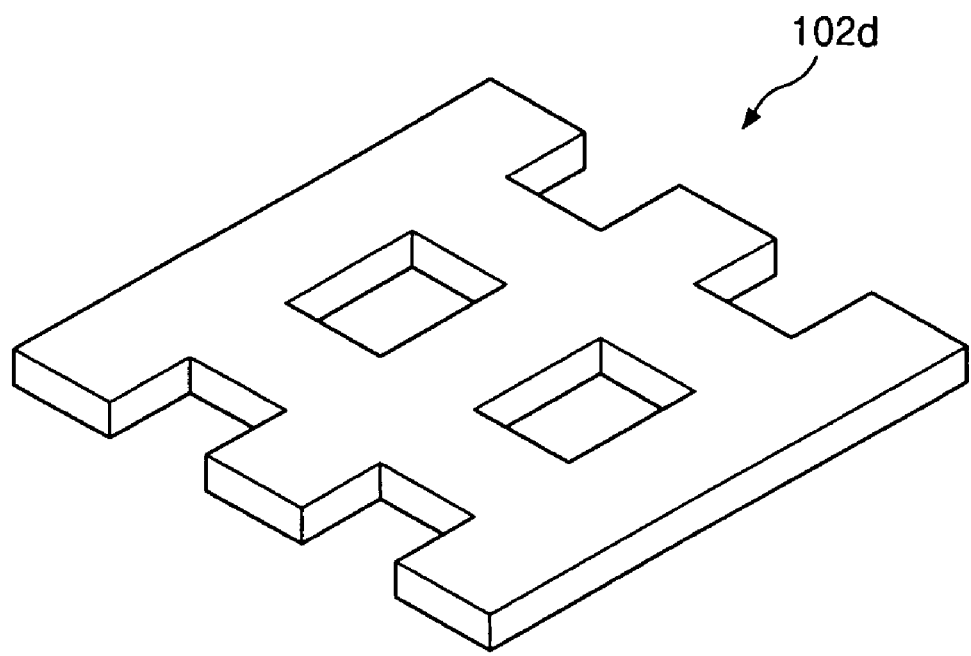

Also referring to FIGS. 2, 7, and 9, a reflector 102d has a shape of a sheet of reflecting material with openings formed through such a sheet. In that case, the line III-III' in FIG. 2 for forming the cross-sectional view of FIG. 7 is through such openings in the sheet of reflecting material 102d. In addition in FIG. 7, a charge carrier guiding region 104d is formed to surround the reflector 102d. The materials of the reflector 102d and the charge carrier guiding region 104d of FIG. 7 are similar to the materials of the reflector 102a and the charge carrier guiding region 104a, respectively, as described above in reference to FIG. 3.

Figure 10:
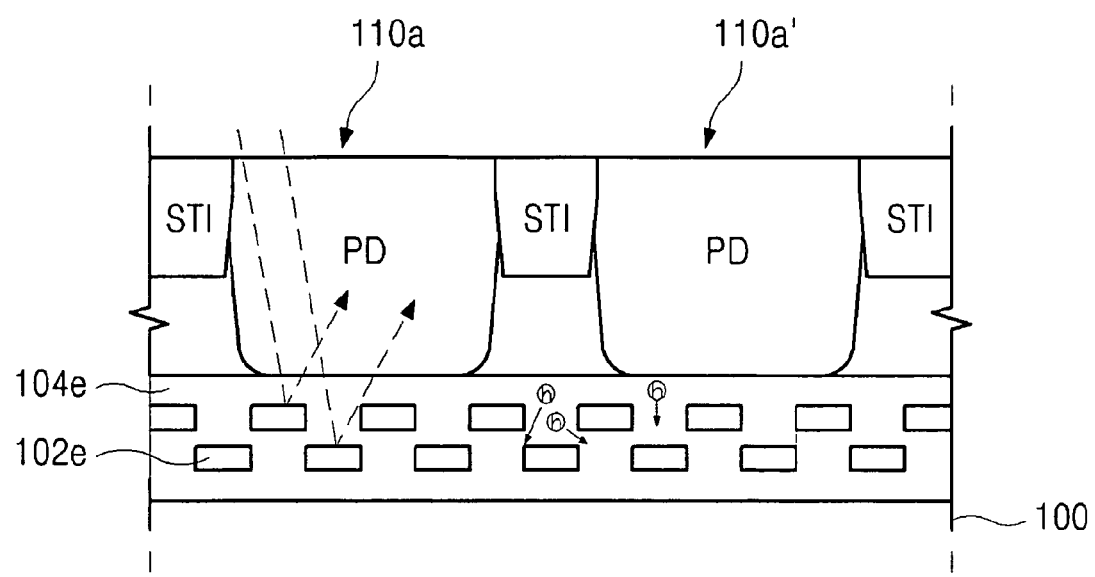
Figure 11:
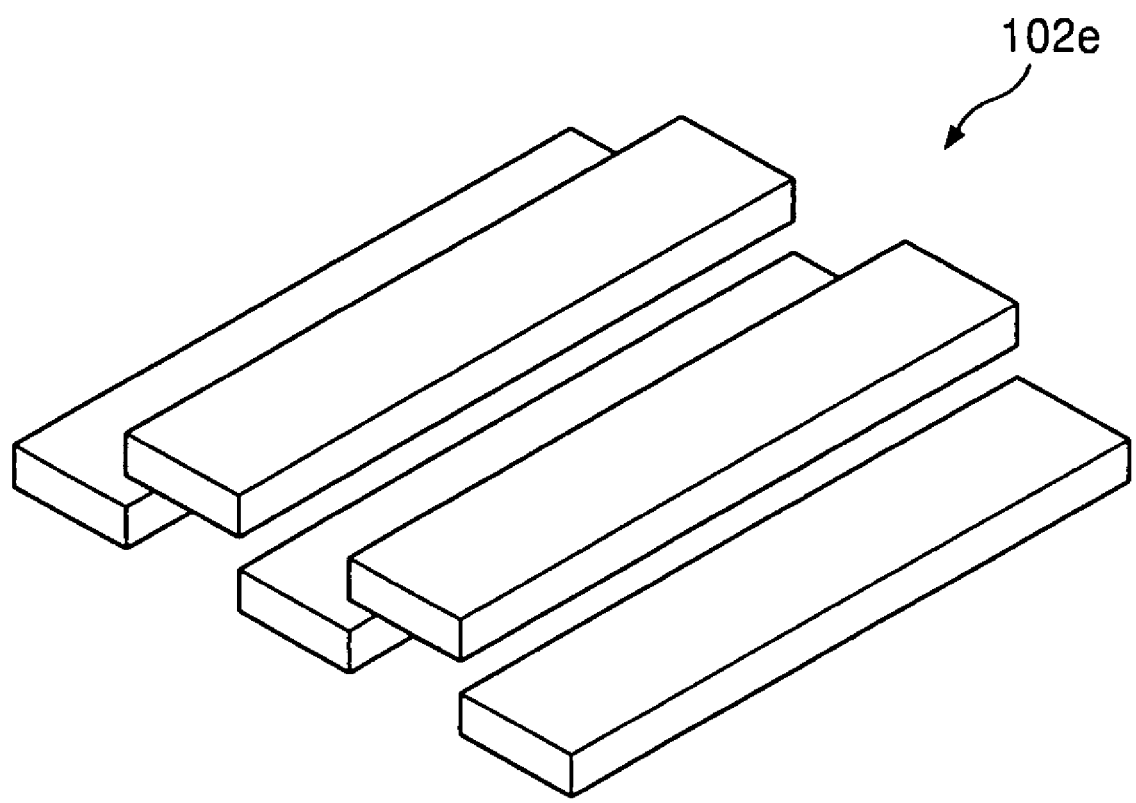

Alternatively referring to FIGS. 2, 10, and 11, a reflector 102e is comprised of a first plurality of bars disposed parallel to each-other but perpendicular to the line III-III' of FIG. 2 in a first plane. The reflector 102e of FIGS. 10 and 11 are also comprised of a second plurality of bars disposed parallel to each-other but perpendicular to the line III-III' of FIG. 2 in a second plane different from the first plane. In addition for the reflector 102e of FIGS. 10 and 11, the first plurality of bars do not overlap the second plurality of bars.

The materials of the reflector 102e and the charge carrier guiding region 104e of FIG. 10 are similar to the materials of the reflector 102a and the charge carrier guiding region 104a, respectively, as described above in reference to FIG. 3.

The alternative embodiments of reflectors 102b, 102c, 102d, and 102e are each disposed below the photodiodes PD. Thus, each of the reflectors 102b, 102c, 102d, and 102e reflects light passed by the photodiode PD back toward the photodiode PD for increasing photoelectric conversion efficiency of the photodiodes PD.

Also, the alternative embodiments of reflectors 102b, 102c, 102d, and 102e are surrounded by respective charge carrier guiding regions 104b, 104c, 104d, and 104e being biased with a low power voltage such as the ground voltage GND for dissipating undesired charge carriers such as holes.

Furthermore, each of the alternative embodiments of reflectors 102b, 102c, 102d, and 102e provides space between the reflecting material that retains heat. Such space between the reflecting material of the reflector 102b, 102c, 102d, or 102e provides a path for heat conduction such that heat is effectively dissipated.

Although not shown, an alternative reflector may be formed to include multiple sheets of reflecting material with each sheet having openings formed through the sheet. Such openings through the sheets may be formed to not overlap each other for effectively reflecting incident light back toward the photodiodes PD and for effectively dissipating heat through the surrounding charge carrier guiding region.

In this manner, the image sensor of embodiments of the present invention includes a reflector disposed below the photodiodes for reflecting incident light back toward the photodiodes for increasing photoelectric conversion efficiency of the photodiodes and for reduced crosstalk. In addition, a charge carrier guiding region surrounds the reflector for dissipating undesired electric charge for further increasing photoelectric conversion efficiency. Furthermore, the reflector may have a shape with spacing for facilitating heat transfer and dissipation.

While the present invention has been shown and described with reference to exemplary embodiments thereof, it will be understood by those of ordinary skill in the art that various changes in form and detail may be made herein without departing from the spirit and scope of the present invention, as defined by the following claims.

What is claimed is:

1. An image sensor comprising:
a photoelectric converter formed in a well that is doped with a first dopant of a first conductivity type;
a reflector disposed under the photoelectric converter; and
a charge carrier guiding region disposed between the photoelectric converter and the reflector, wherein said charge carrier guiding region is doped with a second dopant that is of said same first conductivity type of said well, and wherein a concentration of said second dopant in said charge carrier guiding region is greater than a concentration of said first dopant in said well.

2. The image sensor of claim 1, further comprising:
a substrate disposed below the reflector, wherein said well abuts said photoelectric converter and said charge carrier guiding region.

3. The image sensor of claim 1, wherein the photoelectric converter includes:
a photodiode having an N-type region formed in a P-well that is said well; and
a P+ type pinning layer formed on the N-type region toward a surface of the N-type region, wherein said P-well abuts said N-type region and said charge carrier guiding region.

4. The image sensor of claim 3, wherein the charge carrier guiding region is doped with said second dopant being a P-type dopant and is biased with a low power voltage for dissipating holes, and wherein said photoelectric converter is doped with said first dopant being a P-type dopant.

5. The image sensor of claim 1, wherein the reflector is comprised of an insulating material.

6. The image sensor of claim 5, wherein the reflector is comprised of a buried silicon oxide layer.

7. The image sensor of claim 1, wherein the charge carrier guiding region is doped with a P-type dopant for dissipating holes.

8. The image sensor of claim 7, wherein the charge carrier guiding region is biased with a low power voltage.

9. The image sensor of claim 1, wherein the charge carrier guiding region is biased with a low power voltage for dissipating holes.

10. The image sensor of claim 1, wherein the charge carrier guiding region is disposed above and below the reflector.

11. The image sensor of claim 1, wherein the charge carrier guiding region surrounds the reflector.

12. The image sensor of claim 1, wherein the reflector has a shape of a sheet of reflecting material disposed below a plurality of photoelectric converters.

13. The image sensor of claim 1, wherein the reflector has a shape of a plurality of bars disposed parallel to each-other.

14. The image sensor of claim 13, wherein the charge carrier guiding region surrounds the bars of the reflector.

15. Image sensor of claim 1, wherein the reflector has a shape of a sheet of reflecting material disposed below a plurality of photoelectric converters with openings formed through the sheet of reflecting material.

16. The image sensor of claim 15, wherein the charge carrier guiding region surrounds the reflecting material.

17. The image sensor of claim 1, wherein the reflector has a shape of a first plurality of bars disposed parallel to each-other in a first plane, and a second plurality of bars disposed parallel to each-other in a second plane.

18. The image sensor of claim 17, wherein the first plurality of bars do not overlap the second plurality of bars.

19. The image sensor of claim 18, wherein the charge carrier guiding region surrounds the first and second pluralities of bars.

20. The image sensor of claim 1, wherein the image sensor is a CMOS image sensor.

* * * * *